United States Patent [19]
Poor et al.
[11] 3,753,818
[45] Aug. 21, 1973

[54] AMMONIACAL ETCHING SOLUTION AND METHOD UTILIZING SAME

[75] Inventors: John Gove Poor, Brunswick, Maine; Grace F. Hsu, Rockville, Conn.

[73] Assignee: Conversion Chemical Corporation, Rockville, Conn.

[22] Filed: Jan. 26, 1972

[21] Appl. No.: 221,088

Related U.S. Application Data

[63] Continuation-in-part of Ser. No. 35,263, May 6, 1970, which is a continuation-in-part of Ser. No. 834,542, June 18, 1969, abandoned.

[52] U.S. Cl. .......... 156/19, 156/3, 156/18, 252/79.4, 252/79.5
[51] Int. Cl. .......... H05k 3/06, C23g 1/18
[58] Field of Search .......... 156/3, 18, 19; 252/79.2, 79.3, 79.4, 79.5; 260/501, 539

[56] References Cited

UNITED STATES PATENTS

| | | | |
|---|---|---|---|
| 2,554,972 | 5/1951 | Alquist et al. | 260/501 |
| 2,740,813 | 4/1956 | Thornberg et al. | 260/539 |
| 2,978,301 | 4/1961 | Margulies et al. | 156/18 |
| 3,322,673 | 5/1967 | Slominski | 252/79.3 |
| 3,362,911 | 1/1968 | Byers et al. | 252/79.2 |
| 3,677,950 | 7/1972 | Alderuccio | 252/79.5 |

OTHER PUBLICATIONS

Trihalogen–Methyl Reactions III Use of Ag Cathode in Electro–Deposition of Cu., Doughty et al., J. of Amer. Chem. Soc., Vol. 43, 1921, pp. 700–704.

*Primary Examiner*—J. Steinberg
*Attorney*—Peter L. Costas

[57] ABSTRACT

An aqueous ammoniacal etching solution for metallic surfaces contains, at makeup, ammonium haloacetate, ammonium hydroxide, and a promoter selected from the group consisting of soluble iodide, bromide and noble metal compounds; preferably, the solution also contains a soluble cupric compound. The solution may be used for spray or immersion etching of copper, cadmium, zinc, aluminum and alloys of such metals.

24 Claims, No Drawings

AMMONIACAL ETCHING SOLUTION AND METHOD UTILIZING SAME

REFERENCE TO RELATED APPLICATION

This application is a continuation-in-part of our copending application Ser. No. 35,263, filed May 6, 1970, which in turn is a continuation-in-part of copending application Ser. No. 834,542, filed June 18, 1969, now abandoned.

BACKGROUND OF THE INVENTION

Although formulations exist for etching and/or chemical milling of metallic surfaces, a significant need remains for compositions that achieve the desired result quickly and uniformly, and at relatively low elevated operating temperatures. Etchants are now widely used in the production of printed circuit boards and similar electronic circuit elements because they are capable of producing the precise and complex patterns of metal which are frequently required. For such use, the etchant must selectively attack the metal to be etched (copper is most often used for the printed circuit elements) and leave substantially unaffected the "resist pattern" which is conventionally of gold, tin, a tin/lead alloy, an organic material, etc.

One technique which has been developed and is particularly suited for printed circuit board manufacture is that of spray etching wherein the contact time of any particular portion of the etchant is very short, i.e., about a second or less. However, this technique requires a very rapid initial rate of attack, and so far as is known, no etchant has heretofore been available which is operative at a practical rate at relatively low elevated temperatures and which is entirely satisfactory for spray etching.

Accordingly, it is an object of the invention to provide a novel composition which is capable of etching a metal surface quickly and uniformly and at a relatively low elevated operating temperature.

It is also an object of the invention to provide such a composition which is useful in the manufacture of printed circuit boards wherein selective attack upon a metallic surface is desired.

Another object is to provide such a composition which rapidly attacks a metal surface so that it may be used advantageously in spray etching techniques.

Still another object is to provide an etchant that possesses a high capacity for metal dissolution and in which the precipitation of insoluble compounds may be minimized.

SUMMARY OF THE INVENTION

It has now been found that the foregoing and related objects can be readily attained in an aqueous ammoniacal etching solution for the etching of metals selected from the group consisting of copper, zinc, cadmium, aluminum and alloys in which one of these metals predominates, and consisting essentially of, on a per liter basis, at makeup, of ammonium haloacetate of the formula:

$$CX_nH_{(3-n)}COO-NH_4$$

wherein X represents a substituent selected from the group consisting of chlorine, bromine and iodine, and wherein $n$ is an integer from 1 to 3. The solution also contains ammonium hydroxide; and an effective amount of a promoter selected from the group consisting of soluble iodide and bromide salts, soluble noble metal salts and oxides, and mixtures thereof; it has a pH value of about 7.5 – 11.0. It may also contain up to 4.0 gram moles of ammonium chloride; up to 0.5 gram mole of soluble phosphate salts having the formula $M_3PO_4$ where M is $NH_4$ or an alkali metal; up to saturation of a soluble cupric compound selected from the group consisting of cupric haloacetate, cupric chloride, cupric acetate, cupric hydroxide, ammonia complexes of such cupric salts and hydroxide, and mixtures thereof. The total ammonium ion in the solution at makeup is 2.5 – 10.0 gram moles and the total haloacetate radical at makeup is 0.5 – 2.0 gram moles.

In preferred embodiments, the solution does contain about 0.1 to 0.6 gram mole of cupric ion and/or about 0.2 to 3.0 gram moles of chloride ion; the promoter may be a combination of ions of at least one of iodide and bromide and of at least one noble metal. Most desirably, the haloacetate is provided by adding trichloroacetic acid and neutralizing it to the ammonium salt; and the promoter is a combination of iodide and mercuric ions. The ammonium chloride may be provided by adding about 1.0 to 3.0, and preferably about 1.25 to 2.0, gram moles of ammonium chloride; and the solution may additionally contain about 0.05 to 0.5 gram mole of phosphate salt, preferably provided by adding trisodium phosphate.

In accordance with the method of the invention, an aqueous ammoniacal solution having the composition previously defined is first prepared and is maintained at a pH of above about 7.5 and at a temperature of at least about 100° Fahrenheit. The metallic surface of a workpiece is contacted with the solution for a period of time sufficient to produce the desired etching thereof, and finally any residue of the solution is removed from the etched surface. Preferably, the solution is maintained at a pH of about 8.0 to 10.5 and at a temperature of about 110° to 130° Fahrenheit. The step of contacting the metal surface with the solution may be effected by spraying, so that the period of contact of any finite portion of the solution is less than about one second, in which case the promoter preferably consists essentially of a noble metal ion.

The solution may be employed, over an extended period of time, to etch the metallic surface of a multiplicity of workpieces by contact therewith. After it contains about 2.0 gram moles per liter of the metal of the metallic surface, a portion of the solution is removed and replaced with approximately the same volume of a fresh solution containing a quantity of ammonium chloride. The amount of ammonium chloride in the fresh solution is such as will maintain the molar concentration of chloride ion in the solution at about 2.0 to 4.0. The fresh solution contains a quantity of the promoter sufficient to maintain it at an effective concentration, and also a quantity of ammonium hydroxide sufficient to adjust the pH of the replenished solution to about 10.0. Alternatively, the pH may be maintained at the desired value by adding ammonia gas or ammonium hydroxide.

DETAILED DESCRIPTION OF THE PREFERRED EMBODIMENTS

A basic component of the bath is the haloacetate salt containing the radical:

$$CX_nH_{(3-n)}COO—$$

wherein the substituent designated X may be chlorine, bromine or iodine and $n$ represents an integer from 1 to 3. Thus, the term "haloacetate" is broadly employed to encompass any of numerous compounds which would provide an acetate radical which is tri-, di-, or mono-substituted with chlorine, bromine or iodine atoms, or mixtures thereof. The chlorine-substituted compounds are preferred largely due to the normally greater expense of similar compounds substituted with bromine or iodine atoms, and the tri-substituted compounds are most desirably employed. It should be appreciated that use of the term "haloacetate salt" encompasses haloacetates which may be formed in situ or which may be introduced initially.

Due to the quantities of the ammonium hydroxide which are required in the present solutions, haloacetate radical will usually be present at makeup as ammonium haloacetate even when introduced as haloacetic acid or as an alkali metal salt. For purposes of definition of composition, the haloacetate radical is thus considered as present at makeup as ammonium haloacetate due to its ionization constant. As regards quantities, the solution should contain about 0.5 to 2.0 gram moles per liter of the haloacetate radical, and most desirably about 0.75 to 1.5 gram moles per liter thereof. If more than about 2.0 gram moles per liter are present, the amount of base which is necessary to adjust the pH to the desired operating range tends to result in instability, particularly at elevated temperatures. Providing less than about 0.75 gram mole per liter of this radical tends to produce a solution which is not sufficiently effective as an etchant as measured by initial rate of attack.

A second fundamental component of the bath is ammonium hydroxide. As will be appreciated, the ammonium radical will be in equilibrium with dissolved ammonia, and ammonia molecules will form complexes with the salts and hydroxide of the copper as the amount thereof in solution is increased. Most desirably, a quantity of ammoniacal constituents will be included in the solution which is sufficient to produce a significant quantity of free ammonia dissolved therein. It will be apparent that the desired ammonium ion and ammonia can be furnished by any of numerous compounds such as ammonium chloride, ammonium hydroxide, etc. and the addition of the amount of ammonium hydroxide (or ammonia gas) necessary to provide the desired quantity of the ammonium ion will also result in a pH value that is within the desired operating range, and vice versa. Initially much of the ammonium radical will be present in the form of ammonium haloacetate because of the large amount of haloacetate radical in the solution. Because of the alkalinity of the solution, the ammonium ion and ammonia at makeup which do not form compounds with chloride ion and haloacetate radicals may be considered as being present as ammonium hydroxide although subsequently considerable amounts of the ammoniacal constituent will be complexed with copper as the amount thereof in solution is increased. A liter of the solution, at makeup, should provide about 2.5 to 10.0 gram moles of ammonium radical and most desirably about 4.0 to 9.0 gram moles thereof. When the ammonium radical is in the upper portion of the above range, it has a beneficial effect upon the rate of etch, but exceeding the level of about 10.0 gram moles per liter tends to result in instability and breakdown of the components of the bath to form undesirable byproducts. In operation, ammonia gas and ammonium hydroxide are added to maintain the desired pH and thus maintain the excess of ammonium hydroxide required for operation.

Although cupric ion is not essential, its presence in the solutions effects a considerable increase in the rate of etch and constitutes a preferred embodiment of the invention, particularly when the solution is to be employed for spray etching. The cupric ion at makeup will normally be present in the solution as one or more soluble compounds thereof depending upon the other ions present, i.e., cupric haloacetate, cupric chloride, cupric acetate, cupric hydroxide, the ammonia complexes thereof, and mixtures thereof.

The presence of chloride ion is also very desirable, particularly in conjunction with the cupric ion; as a result, it is particularly advantageous to include about 0.1 to 0.6 gram mole per liter of cupric chloride ($CuCl_2 \cdot 2H_2O$) in the solution to furnish both ions, and preferably the concentration thereof will be about 0.2 to 0.5 gram mole per liter. Utilizing more than about 0.6 gram mole per liter of the cupric ion tends to be wasteful; however, it may be advantageous to include as much as about 3.0 gram moles per liter or more of the chloride ion, although normally the initial concentration thereof will not exceed about 2.0 molar. Accordingly, when cupric chloride is used, it may also be desirable to include a supplementary source of chloride ion, such as ammonium chloride, sodium chloride, potassium chloride, etc. If desired, the entire quantity of chloride ion (other than that which may be derived from a chloracetic acid constituent) may be provided by such compounds and the cupric ion furnished by compounds such as copper sulfate, copper acetate, etc. Since the optimum compositions contain both the necessary ammonium ion and the desirable chloride ion, a particularly preferred component of the present compositions is ammonium chloride. At makeup, it will be appreciated that these components will be present substantially in the form of cupric haloacetate and ammonium chloride because of the heavy concentration of the ammonium ion and haloacetate radical.

Proper operation of the present solutions for etching requires the presence of one or more of the two types of promoters hereinbefore specified, i.e., the soluble iodide or bromide salts and the soluble noble metal salts and oxides. Of the two halides specified, iodide ion is more effective in promoting the rate of etch; however, about 50 to 750 parts by weight per million will normally constitute an effective amount of either halide ion, and they are most readily provided by soluble inorganic salts thereof such as the ammonium and alkali metal salts; i.e. potassium iodide, sodium bromide, and ammonium iodide. Specific examples of the noble metals in the second broad class of promoters which may be employed are silver, divalent palladium, trivalent gold and divalent mercury salts and oxides. Other noble metals are rhodium and platinum. Although the ultimate rate of etch may be obtained by use of the silver ion, the mercury ion is almost as effective and its use is preferred largely because it is less expensive and is effective in much smaller quantities. Optimum concentrations of suitable salts and oxides to provide each of the particular noble metal ions specified previously are as follows (expressed in grams per liter): about 0.15 to 0.40 of silver nitrate, about 0.02 to about 0.06 of palladium chloride, about 0.01 to 0.02 of acid gold trichloride, and about 0.005 to about 0.010 of mercuric oxide. Although higher concentrations of these ions usually effect a significant increase in the reaction rate, there is a tendency for deposition of elemental metal to occur, which effect will usually be undesirable.

As has been mentioned, the various promoters may be employed in numerous combinations, and mixtures of a halide promoter with a noble metal promoter are particularly desirable, especially when the bath is to be used for immersion etching. A preferred combination is produced by dissolving mercury oxide and potassium iodide in the bath; most desirably the chloride and cupric ions are also present in the concentrations hereinbefore specified. Mixtures of the iodide and bromide salts may be used to advantage, as may mixtures of two or more noble metals, such as the silver and mercuric ions, to achieve an optimum balance of etching rate and cost.

The pH of the solution is quite important for satisfactory operation and should be maintained at a value of at least about 7.5, and preferably considerably higher. Values of pH of about 10.0 are highly beneficial, particularly when the solution is fresh, and the preferred pH range is about 8.0 to 10.5. The desired pH can usually be achieved by providing the ammoniacal constituent requirement at least in part with ammonium hydroxide, but other bases, such as sodium hydroxide, can be used for pH control, when the ammoniacal constituent is provided by a salt like ammonium chloride. In the event that the pH value is unduly high, adjustment thereof may be effected with a suitable acid such as hydrochloric, and it will be apparent that, by the use of that acid, a desirable quantity of chloride ion may also be introduced. As previously indicated, the pH is preferably maintained at the desired level during operation by addition of ammonium hydroxide or ammonia to provide the necessary ammonium ion and also free amonia for complexing with copper being dissolved.

Exemplary of the formulations which provide the novel etchants of the present invention is a solution having the following composition:

| | |
|---|---|
| trichloroacetic acid | 165.0 grams |
| ammonium hydroxide (26° Baume) | 400.0 milliliters |
| cupric chloride ($CuCl_2 \cdot 2H_2O$) | 50.0 grams |
| mercuric oxide (HgO) | 0.005 gram |
| water | to make 1 liter of solution |

Etchants having an increased capacity, in terms of avoidance of precipitate formation, are produced by including with the foregoing components about 50.0 to 150.0 grams per liter of ammonium chloride. Preferably about 75.0 to 125.0 and most desirably about 100.0 grams per liter thereof are employed. Although smaller concentrations (lower than about 50.0 grams per liter of ammonium chloride) have some effect, that amount appears to be a practical lower limit; more than about 150.0 grams per liter tends to depress the etching rate to an undesirable degree (particularly after the bath has been used for a time), and some decrease in rate has been noted even at a concentration of 125.0 grams per liter. Ammonium chloride per se is conveniently and economically used, but if so desired the compound may be formed in situ, such as by admixing appropriate amounts of ammonium hydroxide and hydrochloride acid. The addition of the ammonium chloride may be made as a single charge, either initially or after some etching has occurred, or the ammonium chloride may be added incrementally or continuously during the course of operation of the bath.

Under some circumstances it is desirable to include a soluble phosphate compound furnishing the phosphate radical to the bath, since this has been found to reduce significantly the tendency that has been observed for lead-containing resist patterns to darken in this type of etchant, particularly at pH values below about 9.5. The phosphate compound may be added as phosphoric acid or as an ammonium or alkali metal salt and it will be appreciated that the acid will be converted to a salt in the alkaline bath. Thus, at makeup, the phosphate radical in the bath may be regarded as a salt having the formula $M_3PO_4$ where M is $NH_4$ or an alkali metal. As little as about 20.0 grams per liter of trisodium phosphate ($Na_3PO_4 \cdot 12H_2O$) has been found to be effective in this regard, and the concentration thereof may range to the limit of solubility of the specific compound in the solution; a solution about 0.15 molar in phosphate produces desirable results, and a 0.5 molar solution thereof may be the practical maximum. Although the theory underlying this effect is not fully understood, it is believed that the darkening is caused by the formation of elemental lead on the exposed surface, and that the phosphate radical has the ability to inhibit or prevent attack upon the resist material to produce such a deposit.

The temperature of the bath should be maintained at least at about 100° Fahrenheit and up to about 160° Fahrenheit; preferably the temperature is about 110° to 130° Fahrenheit. Although higher temperatures can be used, operation under such conditions tends to be more hazardous and less convenient and the quality of the etch which results tends to be of a lower order; moreover, the more elevated temperatures promote decomposition of the components of the bath and are unnecessary since the bath operates efficiently at the lower temperatures indicated.

In most cases, when the temperature is so maintained, the desired level of etching for printing circuits can be produced on a so-called "one ounce" copper printed circuit board in a period of ten minutes or less. (A one ounce printed circuit board has about one ounce of copper per square foot of area, providing a layer of copper about 1.34 mil thick.) If the variables are optimized, the period may be reduced to six minutes or less and in some cases to less than one minute.

Due to the high initial rates of etch which can be achieved, the solutions described herein are particularly well suited for use in spray etching wherein the time of contact of substantially any finite portion of the solution is less than one second, and in most instances considerably less. It is also of prime importance in such a method that the etchant be effective upon ititial contact, since there is virtually no residence time during which there may be accumulated by-products which may promote the reaction; the high level of initial effectiveness of the present formulations is a particularly beneficial and novel aspect. The preferred solutions for spray etching contain the cupric and noble metal ions, and most desirably also the chloride ion. For immersion etching or chemical milling the preferred solutions contain not only the cupric, chloride, and noble metal ions, but also the bromide or iodide, and preferably the latter. However, it should be understood that either the halide or noble metal promoters may be used without the cupric and/or chloride ions and that they can be used in various combinations including more than one of each species.

The present formulations are particularly suitable for operation over long periods of time on a substantially continuous basis, simply by replenishment of the solution to maintain the pH and the concentrations of certain components within proper ranges of values. Thus, after a sufficient amount of metal has been etched, the bath will normally continue to operate satisfactorily simply by maintaining appropriate concentrations of the ammonium radical, the chloride ion and the promoter, and by maintaining the pH most conveniently by addition of ammonium hydroxide or gaseous ammonia. Use of gaseous ammonia is advantageous in avoiding increases in volume.

More particularly, the chloride ion should be kept at about 2.0 to 4.0 and preferably about 3.0 molar, the ammonium radical somewhat higher, the promoter at a concentration as hereinbefore specified (depending upon the particular promoter), and the pH at a value above about 7.5 and preferably at about 10.0; these conditions are conveniently achieved by adding ammonium chloride and promoter to the bath, and by adjusting the pH when necessary, occasionally with hydrochloric acid and more commonly with ammonium hydroxide or gaseous ammonia. The specific schedule and volumetric rate of removal and replacement will best be determined for each specific solution, but it may be appropriate to commence replenishment after the bath contains about 2.0 moles per liter of dissolved metal (about 150.0 grams per liter in the case of copper) and by replacing 10 percent of the volume at a time, on an incremental basis. Alternatively, additions and removals may be made continuously during recycle of the solution.

The theory of operation of the solutions of the present invention is not fully understood. It is believed that the mechanism in the presence of cupric ion is:

$$Cu^{++} + Cu^{\circ} \rightarrow 2\ Cu^{+}$$

$$2\ Cu^{+} + ½\ O_2 + H_2O \rightarrow 2\ Cu^{++} + 2\ OH^{-}$$

The presence of the large amount of ammonium ion ensures some free ammonia and a copper/ammonia complex is formed to keep the copper in solution:

$$Cu^{++} + 4\ NH_3 \rightarrow Cu\ (NH_3)_4{}^{++}$$

Generally the copper complex is believed to be as the chloride $[Cu\ (NH_3)_4Cl_2]$ or as the hydroxide $[Cu(NH_3)_4(OH)_2]$.

As will be appreciated, oxygen or oxidizing conditions are required for effective operation. This is readily provided in the spray etcher which produces aeration of the solution. In an immersion installation, air agitation is desirable.

The solutions described herein are specific in their attack upon various metals while leaving other metals substantially unaffected. For example, they etch copper, zinc, and cadmium, and alloys thereof such as brass, at rapid rates to produce high quality etched surfaces; they also etch aluminum but the quality of the etch is of a lower order. Metals which are substantially unaffected by these solutions include nickel, gold, silver, lead, tin, iron and various alloys thereof, making the solutions valuable for use not only in electronics applications, but also for other purposes, such as the stripping of copper or the like from steel. They may also be used with many of the organic resist materials which are conventionally used for printed circuit board manufacture, so long as such materials are capable of withstanding mild alkaline solutions at the operating temperatures.

Exemplary of the efficacy of the present invention are the following specific examples, wherein all parts are on a weight basis unless otherwise indicated.

EXAMPLE ONE

One ounce copper printed circuit boards are provided with an organic resist pattern and are thereafter electroplated with about 0.2 to 0.3 mil of tin utilizing a bright acid tin bath using a sulfate electrolyte, sold under the trade name KENVERT TINTILLATE by Conversion Chemical Corporation, of Rockville, Conn. After stripping the organic resist material to expose the copper to be etched, the boards are placed in a laboratory spray etching machine having four separate spray jets and patterned after the production type machines, and are subjected to spray etching therein.

Part A

The etching solution is prepared by dissolving in water about 165 grams per liter of trichloroacetic acid and about 400 milliliters per liter of ammonium hydroxide (26° Baume). This solution is employed in the spray etching machine utilizing one of the one ounce printed circuit boards described above and is found to be essentially ineffective since it produces very little etching of the board after a period of about one hour at a solution temperature of about 100° Fahrenheit. Raising the temperature of the solution to about 125° Fahrenheit produces some improvement, but even at that temperature the rate of etch is not sufficient for practical etching.

Part B

To a solution formulated as in Part A are also added about 50 grams per liter of cupric chloride ($CuCl_2 \cdot 2H_2O$) and about 0.005 grams per liter of mercuric oxide. The pH of the resulting solution is about 10, and it is employed in the spray etching machine at a temperature of about 125° Fahrenheit. The exposed copper surface of a fresh printed circuit board is completely etched away with this solution after a period of about 2 minutes. The solution (containing about 4 ounches per gallon of copper) is then employed to etch a second fresh printed circuit board, and the second board is completely etched after a period of about 1 to 1½ minutes. In neither case is there any visible attack upon the tin deposit and undercutting is negligible. When used on additional printed circuit boards, the rate of etch remains substantially constant throughout the life of the bath.

The addition of about 0.1 gram per liter of potassium iodide increases the etching rate but also increases the level of undercutting to an undesirable degree for precision etching purposes.

Part C

A solution was prepared as in Part B, but having about 100 grams per liter of ammonium chloride added thereto; the pH of the resulting solution was about 9.8. A number of circuit boards were etched with this bath, under conditions of operation similar to those of Part B, until the amount of copper contained in the bath reached a level of about 225.0 to 240 grams per liter. After about 50.0 grams per liter of copper had been dissolved in the bath, the rate of etch was substantially constant (at about 1.5 minutes for complete etching), and virtually no precipitate was noted in the bath until after about 210.0 grams per liter of copper had been dissolved therein.

Part D

The procedure of Part B is substantially repeated but with the substitution for the trichloroacetic acid of a molar equivalent amount of dichloroacetic acid. Comparable results are obtained, although the periods required for complete etching are somewhat more extended.

Part E

The procedure of Part B is substantially repeated, but about 0.2 gram per liter of silver nitrate is employed in place of the mercuric oxide. The rate of etch is improved somewhat as compared with that attained in Part B, and the quality of the etch is comparable in every respect.

EXAMPLE TWO

The same type of printed circuit boards as is employed in Example One is utilized in the following series of tests. Instead of subjecting the boards to spray etching, they are simply immersed in a bath of the etchant, which is moderately agitated and maintained at a controlled temperature. Periodically, the circuit board is removed from the bath for inspection of the extent to which etching has occurred.

Part A

The etching solution is prepared by dissolving in water about 163 grams per liter of trichloroacetic acid, about 400 milliliters per liter of 26° Baume ammonia water, and about 0.1 gram per liter of potassium iodide. The printed circuit board is immersed in the solution, which is agitated and maintained at a temperature of about 130° Fahrenheit. Upon periodic inspection, it is noted that the rate of etch is quite rapid and is significantly greater than that which is noted in a comparable bath from which the potassium iodide has been omitted. The etch is uniform and of good quality, and very little undercutting is evident.

Part B

A solution of the formulation of Part A is modified by the inclusion of about 25 grams per liter of cupric chloride. Utilizing a fresh printed circuit board under the conditions of immersion etching previously described, a more than two-fold increase in the rate of etch is noted.

Part C

A solution is prepared by dissolving in water about 390 grams per liter of tribromoacetic acid, about 400 milliliters per liter of 26° Baume ammonium hydroxide, and about 0.005 gram per liter of mercuric oxide. Immersion of a printed circuit board in the solution maintained under agitation and at about 120° Fahrenheit results in etching thereof at a relatively high rate to produce a good quality etched surface, with no evidence of amalgamation. Repeating the test with about 0.04 gram per liter of mercuric oxide increases the rate of etch but causes some amalgamation with the partly etched surfaces.

Part D

The procedure of Part C is repeated utilizing a solution with the lower concentration of mercury oxide and also including about 150 grams per liter of sodium chloride. The quality of the etch is comparable, and the rate thereof is somewhat higher.

Part E

For immersion etching, a bath is prepared with about 163 grams per liter of trichloroacetic acid, about 400 mils per liter of 26° Baume ammonium hydroxide, about 0.005 gram per liter of mercuric oxide, and about 0.01 gram per liter of potassium iodide. The rate of etch and the quality thereof which are obtained at a bath temperature of about 120° Fahrenheit are found to be very good.

Part F

The bath composition of Part E is modified by inclusion of about 50 grams per liter of cupric chloride. High quality etched surfaces are produced at very rapid rates on a printed circuit board immersed therein, with the bath at a temperature of about 125° Fahrenheit. Lowering the temperature to 100° Fahrenheit decreases the activity of the bath somewhat, but nevertheless produces good results in a commercially practical period of time.

EXAMPLE THREE

Part A

Part C of Example One was substantially repeated, utilizing a tin/lead (63/37) "solder plate" resist pattern on the one ounce copper printed circuit boards, rather than the tin pattern specified therein. Following the procedure of that Part the results were comparable, with the sole exception that there was an observable tendency for greying to occur in the originally semi-bright, white tin/lead deposit. This is considered somewhat undesirable under certain circumstances; if the attack is permitted to become severe, a serious problem of interference with subsequent soldering operations may result.

Part B

After dissolving about 22.5 grams per liter of trisodium phosphate ($Na_3PO_4 \cdot 12H_2O$) in a second portion of the solution employed in Part A, additional copper printed circuit boards bearing tin/lead (63/37) resist patterns were etched therewith under the same conditions. The results were comparable in all respects except that there was no tendency for greying of the resist material, which retained its original semi-bright, white appearance.

Part C

The procedure of Part B of this example was substantially repeated, substituting about 15.5 grams per liter of phosphoric acid for the trisodium phosphate employed therein. The results achieved were comparable in all respects.

EXAMPLE FOUR

Part B of Example One was carried out on a continuous basis by removal of a portion of the bath at various intervals, and replenishment thereof with appropriate quantities of ammonium chloride, ammonium hydroxide, and mercuric oxide dissolved in water. Thus, after about 150.0 grams per liter of copper had been dissolved in the etchant, about 10 percent by volume thereof was removed from the system and replaced by an approximately equal volume of solution. The make-up solution contained sufficient ammonium chloride, mercuric oxide, and ammonium hydroxide to adjust the concentration of chloride ion and ammonium radical to about three molar, the mercury ion to about five parts per million, and the pH value to about 10.0. By periodic replenishment of the bath in this manner, the system may be operated for an extended period of time without any significant down time or detriment to the effectiveness of the etchant or to the quality of the etched surface.

Thus, it can be seen that the present invention provides a novel composition which is capable of etching a metal surface quickly and uniformly and at a relatively low elevated operating temperature. The composition is useful in the manufacture of printed circuit boards and is sufficiently rapid upon initial contact for use in spray etching. The etchant provided has a high capacity for metal dissolution, and the precipitation of insoluble compounds may be minimized therein.

Having thus described the invention, we claim:

1. An aqueous ammoniacal etching solution for the etching of metals selected from the group consisting of copper, zinc, cadmium, aluminum and alloys in which one of these metals comprises the major portion thereof, and consisting essentially of, on a per liter basis at makeup, ammonium haloacetate of the formula $$CX_nH_{(3-n)}COONH_4$$

wherein X represents a substituent selected from the group consisting of chlorine, bromine and iodine, and wherein $n$ is an integer of 1 to 3; ammonium hydroxide; up to 4.0 gram moles of ammonium chloride; up to about 0.5 gram mole of soluble phosphate salts having the formula $M_3PO_4$ where M is $NH_4$ or an alkali metal; up to saturation of a soluble cupric compound selected from the group consisting of cupric haloacetate wherein the haloacetate corresponds to the above formula, cupric chloride, cupric acetate, cupric hydroxide, the ammonia complexes of such compounds, and mixtures thereof; and an effective amount of promoter selected from the group consisting of soluble inorganic iodide and bromide salts, soluble noble metal salts and oxides, and mixtures thereof, said solution having a pH value of about 7.5 to 11.0, the total ammonium ion in said solution at makeup being 2.5 – 10.0 gram moles and the total haloacetate radical in said solution at makeup being about 0.5 – 2.0 gram moles.

2. The solution of claim 1 wherein said cupric compound provides cupric ion in an amount of about 0.1 to 0.6 gram mole in the fresh solution.

3. The solution of claim 1 wherein said ammonium chloride is present in an amount of about 0.2 to 3.0 gram moles.

4. The solution of claim 3 wherein each said solution contains about 1.0 to 3.0 gram moles of ammonium chloride.

5. The solution of claim 1 where said inorganic phosphate salt is present in an amount of about 0.05 to 0.5 gram moles.

6. The solution of claim 5 wherein said phosphate salt is trisodium phosphate.

7. The solution of claim 1 wherein X is chlorine and n is 3 so that said haloacetate is the trichloracetate.

8. The solution of claim 1 wherein said promoter provides a combination of ions of at least one of iodine and bromine and ions of at least one of gold, silver, mercury, platinum, palladium and rhodium.

9. The solution of claim 1 wherein said promoter provides a combination of iodide and mercuric ions.

10. An aqueous ammoniacal etching solution for the etching of metals selected from the group consisting of copper, zinc, cadmium, aluminum and alloys in which one of these metals comprises the major portion thereof, and consisting essentially of, on a per liter basis at makeup, ammonium trichloracetate; ammonium hydroxide; about 0.1 to 0.6 gram mole of a soluble cupric compound selected from the group consisting of cupric trichloroacetate, cupric chloride, cupric acetate, cupric hydroxide, the ammonia complexes of such compounds, and mixtures thereof; 0.2 to 4.0 gram moles of ammonium chloride; 0.0 to 0.5 gram mole of soluble phosphate salts having the formula $M_3PO_4$ where M is $NH_4$ or an alkali metal; and an effective amount of a promoter selected from the group consisting of soluble inorganic iodide and bromide salts, soluble noble metal salts and oxides, and mixtures thereof, said solution having a pH value of about 7.5 to 11.0, the total ammonium ion in said solution at makeup being 2.5 – 10.0 gram moles and the total trichloroacetate radical in said solution at makeup being about 0.5 – 2.0 gram moles.

11. The solution of claim 10 wherein said ammonium chloride provides chloride ion in an amount of about 0.2 to 2.0 gram moles.

12. The solution of claim 11 wherein said ammonium chloride is present in an amount of about 1.25 to 2.0 gram moles.

13. The solution of claim 12 wherein said phosphate salt is present and provided by addition of about 0.05 to 0.5 gram mole of trisodium phosphate.

14. The solution of claim 10 wherein said promoter is an iodide salt.

15. The solution of claim 10 wherein said promoter is a mercuric salt or oxide.

16. The solution of claim 10 wherein said promoter provides a combination of iodide and mercuric ions.

17. The solution of claim 10 wherein said pH is about 8.0 – 10.5.

18. In a method of etching a metal surface the steps comprising: (a) preparing an aqueous ammoniacal solution consisting essentially of, on a per liter basis at makeup, ammonium haloacetate of the formula $$CX_nH_{(3-n)}COONH_4$$

wherein X represents a substituent selected from the group consisting of chlorine, bromine and iodine, and wherein $n$ is an integer of 1 to 3; ammonium hydroxide; up to 4.0 gram moles of ammonium chloride; up to about 0.5 gram of soluble phosphate salt having the formula $M_3PO_4$ where M is $NH_4$ or an alkali metal; up to saturation of a soluble cupric compound selected from the group consisting of cupric haloacetate wherein the haloacetate corresponds to the above formula, cupric chloride, cupric acetate, cupric hydroxide, the ammonia complexes of such compounds, and mixtures thereof; and an effective amount of promoter selected from the group consisting of soluble inorganic iodide and bromide salts, soluble noble metal salts and oxides, and mixtures thereof, the total ammonium ion in said solution at makeup being about 0.5 – 2.0 gram moles and the total haloacetate radical in said solution at makeup being about 0.5 – 2.0 gram moles; (b) maintaining said solution at a pH of about 7.5 to 11.0 and at a temperature of at least about 100° Fahrenheit; (c) contacting the metallic surface of a workpiece with said solution for a period of time sufficient to produce the desired etching of said surface, the metal of said surface being susceptible to attack by said ammoniacal solution and selected from the group consisting of copper, zinc, cadmium, aluminum, and alloys in which one of these metals comprises the major portion thereof, and (d) removing any residue of said solution from said surface.

19. The method of claim 18 wherein said solution is maintained at a pH value of about 8.0 to 11.0 and at a temperature of about 110° to 130° Fahrenheit.

20. The method of claim 18 wherein said step of contacting said metal surface is effected by spraying said solution upon said surface, and wherein the periof of contact of any finite portion of said solution is less than about 1 second.

21. The method of claim 20 wherein said promoter consists essentially of a salt or oxide of a noble metal selected from the class consisting of gold, silver, mercury, platinum, palladium and rhodium.

22. The method of claim 18 wherein said metallic surface has a tin/lead alloy resist pattern thereover, and wherein said phosphate salt is present in an amount of 0.05 to 0.5 gram mole.

23. The method of claim 18 wherein said solution is employed over an extended period of time to etch the metallic surface of a multiplicity of workpieces by contact therewith, and wherein, after said solution contains about 2.0 gram moles per liter of the metal of said surface dissolved therein, said method includes the additional step of (e) removing a portion of said solution and replacing said portion with approximately the same volume of a fresh solution containing a quantity of ammonium chloride dissolved therein sufficient to maintain about a 2.0 to 4.0 molar concentration of chloride ion in said solution.

24. The method of claim 23 wherein said fresh solution also contains a quantity of said promoter sufficient to maintain the concentration thereof effective, and a quantity of ammonium hydroxide sufficient to adjust the pH of said solution to about 10.0.

* * * * *